(12) United States Patent
Nishida et al.

(10) Patent No.: US 8,216,421 B2
(45) Date of Patent: Jul. 10, 2012

(54) PLASMA STABILIZATION METHOD AND PLASMA APPARATUS

(75) Inventors: Takumasa Nishida, Sagamihara (JP); Shu Nakajima, Chigasaki (JP)

(73) Assignee: Lam Research Corporation, Fremont, CA (US)

( * ) Notice: Subject to any disclaimer, the term of this patent is extended or adjusted under 35 U.S.C. 154(b) by 238 days.

(21) Appl. No.: 11/999,708

(22) Filed: Dec. 5, 2007

(65) Prior Publication Data

US 2008/0173403 A1    Jul. 24, 2008

Related U.S. Application Data

(62) Division of application No. 10/427,474, filed on Apr. 30, 2003, now Pat. No. 7,320,941.

(30) Foreign Application Priority Data

Apr. 30, 2002 (JP) .................................. 2002-129241

(51) Int. Cl.
*C23C 16/00* (2006.01)
*H01L 21/306* (2006.01)

(52) U.S. Cl. .......... 156/345.48; 118/723 I; 118/723 AN; 315/111.51

(58) Field of Classification Search ............... 118/723 I, 118/723 IR, 723 AN; 156/345.48, 345.49; 315/111.51

See application file for complete search history.

(56) References Cited

U.S. PATENT DOCUMENTS

| 5,571,366 A * | 11/1996 | Ishii et al. | 156/345.26 |
| 6,214,162 B1 * | 4/2001 | Koshimizu | 156/345.28 |
| 6,375,810 B2 * | 4/2002 | Hong | 204/192.12 |
| 6,494,998 B1 * | 12/2002 | Brcka | 204/192.12 |
| 6,509,542 B1 * | 1/2003 | Benjamin et al. | 219/121.43 |
| 2001/0017109 A1 * | 8/2001 | Liu et al. | 118/723 I |
| 2002/0125223 A1 * | 9/2002 | Johnson et al. | 219/121.43 |
| 2004/0238126 A1 * | 12/2004 | Hayashi et al. | 156/345.48 |
| 2006/0124059 A1 * | 6/2006 | Kim et al. | 118/723 I |

FOREIGN PATENT DOCUMENTS

WO    WO 01/05020    * 1/2001

* cited by examiner

*Primary Examiner* — Luz L. Alejandro
(74) *Attorney, Agent, or Firm* — Martine Penilla Group, LLP

(57) ABSTRACT

A plasma technique in which a plasma generation technique frequently used in various fields including a semiconductor manufacturing process is used, and generation of plasma instability (high-speed impedance change of a plasma) can efficiently be suppressed and controlled in order to manufacture stable products. In a method of disposing an object in a chamber and generating the plasma to treat the object, the chamber is sealed by a surrounding member so as to have an inner space, with at least a part of the member including a dielectric material, an RF induction coil is disposed outside the dielectric member, and a direct-current electric field is supplied into the inner space by a method of passing a direct current through the RF induction coil or another method, so that the plasma is stabilized.

9 Claims, 11 Drawing Sheets

PLASMA STABILIZATION METHOD AND PLASMA APPARATUS

CROSS REFERENCE TO RELATED APPLICATION

This application is a divisional of U.S. application Ser. No. 10/427,474, filed on Apr. 30, 2003 now U.S. Pat. No. 7,320,941. The disclosure of this prior application from which priority is claimed is incorporated herein by reference.

BACKGROUND

1. Field of the Invention

The present invention relates to a processing method and apparatus for a plasma used for frequent use in processing of a semiconductor wafer, in manufacturing an integrated circuit, or a plasma apparatus for performing a plasma treatment.

2. Description of the Related Art

A treatment method using a plasma has heretofore been broadly used because the method is very useful in various semiconductor manufacturing processes such as etching, resist removal, and vapor deposition. For inductively coupled plasmas for generally frequent use, such as TCP and ICP, a predetermined gas is passed through a chamber sealed by a surrounding member including a dielectric window member, and an RF current, for example, of 13.56 MHz is passed through an RF induction coil disposed in the vicinity of the outside of the window member. Thereby, an electromagnetic field is generated in the chamber, and an electron is accelerated and collides against a molecule so that an ion and radical are generated.

This ion and radical have a very high reactivity, and are frequently used in treatment processes such as plasma etching and plasma deposition. The inductively coupled plasma has advantages such as that a high-density plasma can be generated, a large wafer area can be handled, and the induction coil does not contact the plasma without polluting any metal. Therefore, the plasma still fulfils a most important function in a semiconductor manufacturing field.

However, electric and magnetic fields are simultaneously generated in the inductively coupled plasma, and a drift is generated in the electron. This brings the plasma into an unstable state, and a phenomenon called a plasma instability occurs. This is a problem inherent in this field. Moreover, when a reflected wave (reflection power) indicating a value not less than a predetermined value is generated because of the plasma instability, a manufactured product is variously adversely affected. Here, problems caused by the plasma instability in manufacturing semiconductor products such as an integrated circuit will concretely be described. The problems include instability of a manufacturing process, damage to the product, decreased yield, drop of operation ratio, differences generated among manufacturing apparatus, and the like.

Examples of conditions under which the plasma instability is generated roughly include several factors such as a process gas type, gas pressure, and RF power. Even if optimum process conditions are established, the optimum process conditions have to be sometimes changed because of the plasma instability (reflection power generation).

Moreover, the plasma instability has not been fundamentally solved for a long time since observed, and an effective method of suppressing the plasma instability has not yet been obtained.

SUMMARY

The present invention can be implemented in numerous ways, including as a process, an apparatus, a system, a device, a method, or a computer readable media. Several embodiments of the present invention are described below.

An object of the present invention is to provide a plasma technique in which a plasma generation technique broadly used in various fields such as a semiconductor manufacturing process is used, and a plasma instability is effectively inhibited from being generated and can further be controlled in order to steadily manufacture a satisfactory product.

To solve the above-described problems and achieve the desired object, a plasma stabilization method and plasma apparatus according to the present invention are obtained by the following means.

In one embodiment of the invention, a plasma stabilization method is disclosed. In a plasma processing chamber, a plasma stabilization method includes sealing the plasma processing chamber with a surrounding member to create an inner space. At least a part of the surrounding member is constituted with a dielectric member. An RF induction coil is disposed outside the dielectric member, and a direct-current magnetic field is supplied to the inner space with an apparatus in which a direct current is passed through the RF induction coil to obtain the direct-current magnetic field.

In another embodiment, a plasma processing apparatus disclosed. The plasma processing apparatus includes a processing chamber having an object to be processed disposed within the processing chamber. The plasma processing apparatus further includes a surrounding member disposed around the processing chamber. The surrounding member seals the chamber and creates an inner space and includes a dielectric member. The plasma processing apparatus further includes an RF induction coil is disposed outside the dielectric member. A direct-current magnetic field is supplied to the inner space by a structure in which a direct current is passed through the RF induction coil to obtain the direct-current magnetic field.

In a further embodiment of the invention, a plasma processing chamber is disclosed. In a plasma processing system for the processing of semiconductor wafers, a plasma processing chamber includes a surrounding member disposed around the plasma processing chamber. The surrounding member seals the plasma processing chamber and creates an inner space. A dielectric member constitutes at least a portion of the surrounding member, and the dielectric member is configured as a quartz window. The plasma processing chamber further includes an RF induction coil, and an RF cut filter through which direct current is supplied to the RF induction coil.

With the use of the electromagnet, the plasma instability control can effectively be performed, when the intensity, arrangement position and number, polarity, and the like of the magnet are appropriately changed.

Examples of a method of passing the direct current include: methods of (1) supplying a constant current; (2) controlling and supplying the current in accordance with the plasma instability; and (3) intermittently supplying the current in order to suppress the plasma instability beforehand.

Other advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Plasma stabilization methods and a plasma apparatus configured to effect plasma stabilization are described.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Embodiments of a plasma stabilization method and plasma apparatus according to the present invention will next be described in detail with reference to FIGS. 1 to 6.

Figure 1:
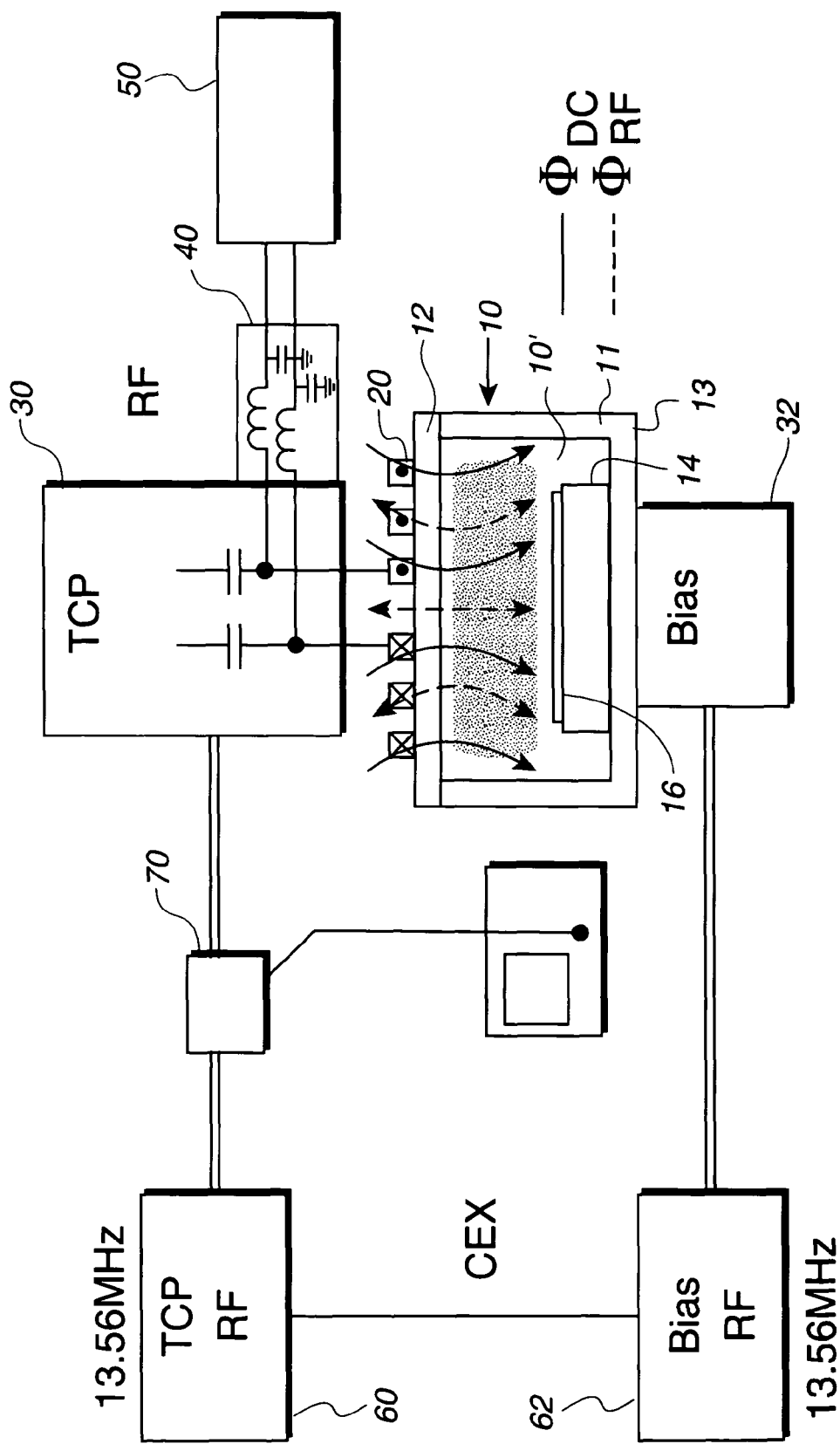
FIG. 1 is a diagram of a plasma apparatus in which plasma instability by a direct-current magnetic field supply is improved, in accordance with one embodiment of the present invention.

A basic constitution of the plasma apparatus according to the present invention will be described with reference to FIG. 1. As shown in FIG. 1, in the plasma apparatus, an object 16 is disposed on a lower electrode 14 inside a chamber 10, and the object 16 is treated by the generated plasma. The chamber 10 is closed by a surrounding member including an upper surface portion 12, side surface portion 11 and bottom surface portion 13 so as to have an inner space 10'. Moreover, at least a part of the surrounding member includes a dielectric material, but a dielectric window portion (quartz window) is disposed in the upper surface portion 12 in FIG. 1, an RF induction coil 20 is disposed outside (above) the dielectric member, and a direct current is passed through the RF induction coil 20 in a system (structure). Furthermore, in another system (structure), the direct-current magnetic field is obtained by a coil other than the RF induction coil or a magnet, so that the apparatus is constituted to supply a direct-current electric field to the inner space 10'. Here, $\phi_{DC}$ indicates a flow of direct-current magnetic flux by the direct current, the flow passes through the upper surface portion 12, and an arrow is directed in one direction (downwards in the drawing). Moreover, $\phi_{RF}$ indicates an RF magnetic flux by the RF current supplied from the RF power supply, and the arrow turns in opposite directions (upwards and downwards in the drawing) via the upper surface portion 12.

In one embodiment, a conventional plasma apparatus including three constituting elements of an RF power supply (1), matching unit (2), and plasma generation chamber (3) are briefly described. An RF power supplied from the high-frequency power supply (RF power supply (1)) causes mismatching in the matching unit (2) by the vibration of the plasma impedance, and returns as a reflection power whose amplitude vibrates at the high speed to the RF power supply (1). Additionally, since the matching unit (2) cannot follow the vibration speed of the plasma impedance, the reflection cannot be suppressed, and the reflection power causes an automatic matching trouble of the matching unit (2). As a result, the reflection wave is generated which cannot be handled by the RF power supply (1) or the matching unit (2) and which has a value not less than a predetermined value. Under these conditions, a product being manufactured is adversely affected. Therefore, it is necessary to suppress the generation of plasma instability (high-speed impedance change of the plasma) in order to manufacture the stable product without being influenced. In an embodiment of the present invention, the direct-current magnetic field is supplied into the plasma having caused the plasma instability, the drift speed of the electrons is reduced or controlled, the deviation on the plasma surface is eliminated, and it is possible to allow the instability to disappear. In this manner, an embodiment of the present invention can provide a remarkably effective countermeasure in order to solve the problem of the plasma instability.

Figure 2:
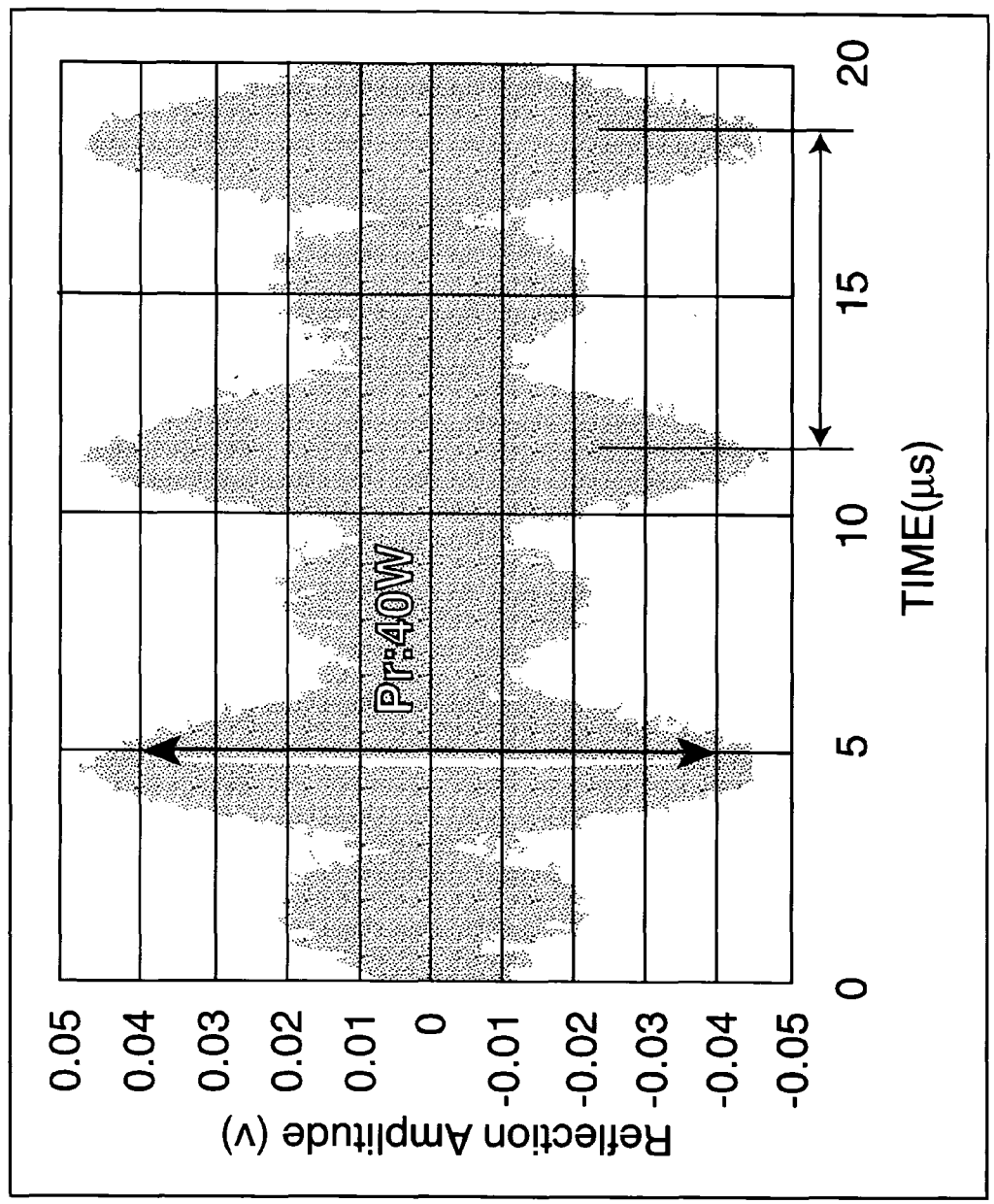
FIG. 2 is a data graph obtained based on a conventional method or apparatus, in which a reflection power waveform to an RF power supply during generation of the plasma instability is shown, and detected by a directional coupler of about −63 dB.

In one embodiment of the present invention, a large number of reflection waveforms were monitored with the plasma instability seen therein, and various data obtained. The data, being studied in detail, is graphically displayed. FIG. 2 shows one example of the data measured and obtained from an embodiment of the present invention, the apparatus having a constitution including the measurement system apparatus of FIG. 1. FIG. 2 shows the data obtained by detecting the reflection power waveform into the RF power supply during the generation of the plasma instability with a directional coupler of about −63 dB. FIG. 2 shows the vibration of the reflected wave detected by the directional coupler in a relation between time (s) and amplitude (Vpp). As shown in FIG. 2, a reflection amplitude largely fluctuates with an elapse of time (time interval of about 145 kHz). In one embodiment, it was determined that the reflection waveform into the RF power supply in the unstable state indicates the instability of the plasma. In one embodiment, the instability is a vibration of plasma impedance, and caused by external factors such as the instability of the RF power supply.

Deduced reasons for causing the plasma instability are as follows. That is, an electron positioned around the plasma is influenced both by an RF magnetic field (B) change and ion sheath electric field (E) change between the plasma and a chamber wall. The electrons alternately drift toward an angle of direction of the plasma apparatus by the magnetic field (B) and electric field (E) (in a direction vertical to the magnetic field B and electric field E), and are rotated in one direction with a time average.

This drift rotates the electron around a circular cylinder of the plasma, a nonuniform plasma density change (like a surface wave of water) sometimes occurs in the surface of the electron, and thereby the plasma impedance is fluctuated at a frequency relatively lower than an RF frequency. This supposedly causes the instability of the plasma. Therefore, the phenomenon can be resolved by supplying the direct-current magnetic field to the plasma from the outside. Moreover, when the drift speed of the electrons is controlled, it is possible to control the plasma instability. In embodiments of the present invention, a stabilized plasma apparatus is realized in this manner.

In a plasma apparatus in which a conventional method shown by the data of FIG. 2 was based, the vibration of the reflection wave was measured at about 145 kHz. However, under other conditions, a range of about 50 kHz to 300 kHz of the vibration of the reflection wave having caused the plasma instability was observed. This range indicates the vibration at a considerably high speed. The considerably high speed vibration resulted from the plasma impedance at the speed. As described above, the cause for the generation of the plasma instability is supposedly that the electrons in the surface of a plasma circumference are influenced by the magnetic and electric fields and drift, and that a deviation is generated and a standing wave is generated. As a result, it is presumed that the plasma impedance changes at a high speed of 50 kHz to 300 kHz.

Figure 3A:
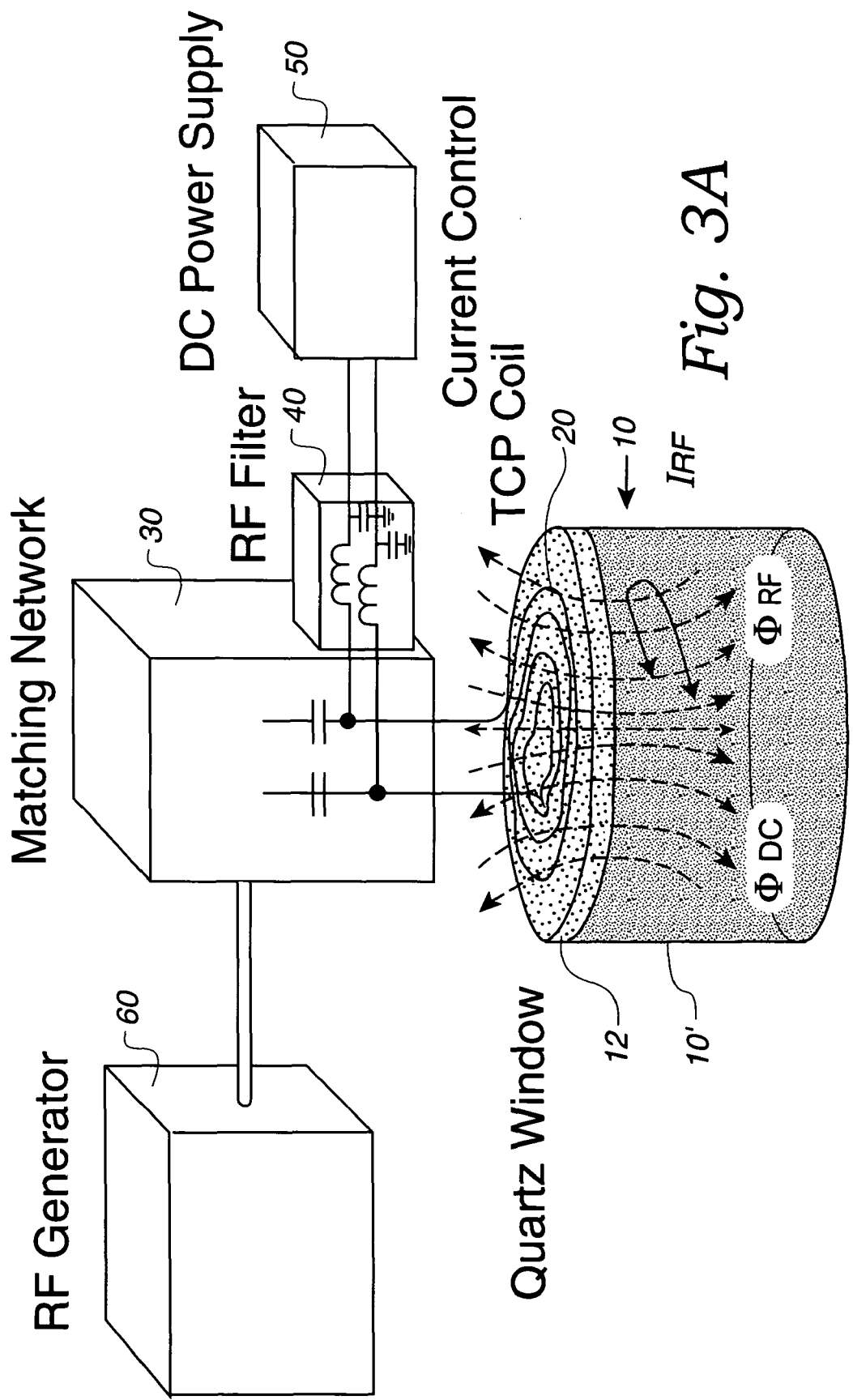
FIG. 3A is a schematic constitution diagram by a method of supplying an RF and direct current to an RF induction coil at the same time, in accordance with one embodiment of the invention.
Figure 3B:
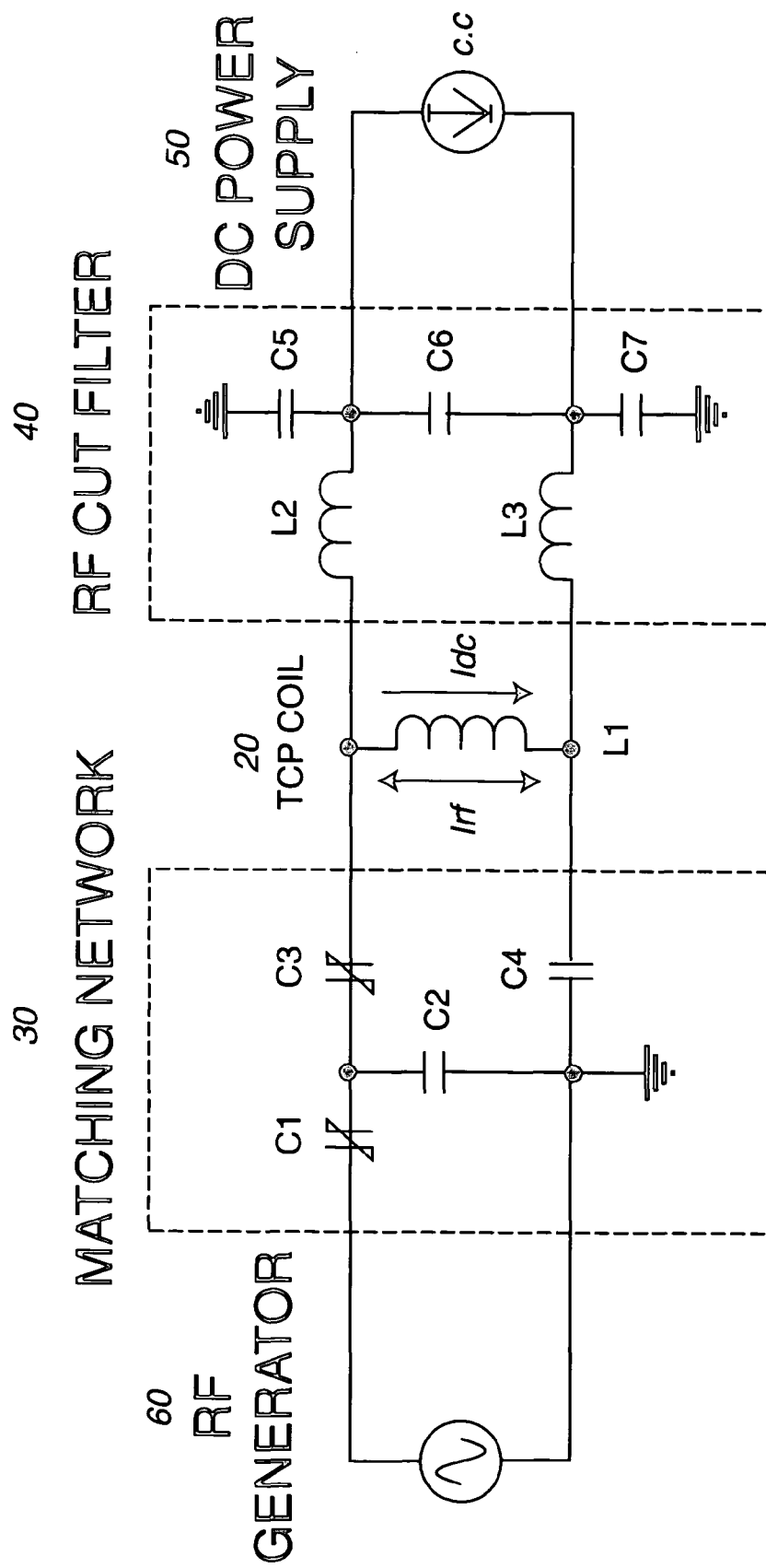
FIG. 3B is an electric circuit diagram of the apparatus shown in FIG. 3A.

FIGS. 3A and 3B will next be referred to. FIG. 3A shows one embodiment of the plasma apparatus according to the present invention, and is a constitution diagram showing the basic constituting elements. FIG. 3B is a diagram showing an electric circuit constitution of FIG. 3A. In FIGS. 3A and 3B, the object is disposed inside the chamber 10, and is treated by the generated plasma in the plasma apparatus. The chamber 10 is sealed and surrounded with a plurality of members so as to have the inner space. The upper surface portion 12 of the chamber is referred to as a quartz window 12 as a window portion of a dielectric material, and the entire RF induction coil 20 is disposed outside (above) and in the vicinity of the quartz window 12 (dielectric member).

In FIG. 3A, an RF generator 60 supplies an RF current to the RF induction coil 20 via a matching network 30. Moreover, a DC power supply 50 simultaneously supplies a direct current to the RF induction coil 20 via an RF cut filter 40 separated from the DC power supply 50. In one embodiment, the matching network 30 includes a plurality of capacitors C2, C4 and variable capacitors C1, C3, and the RF cut filter 40 is constituted to include coils L2, L3 and a plurality of capacitors C5, C6, C7. Capacitor C7 is connected between the positive terminal of DC power supply 50 and ground, and capacitor C5 is connected between the negative terminal of DC power supply 50 and ground. Capacitor C6 is connected between the positive terminal and the negative terminal of DC power supply 50.

As shown in FIG. 3A, with the above-described combination of the constituting elements, essential requirements of the present invention are satisfied by passing the direct current to the RF induction coil 20 or by supplying the direct-current magnetic field to the inner space 10'. In a plasma treatment method according to the present invention to which the direct-current magnetic field is applied, in one embodiment of the present invention of FIG. 3A, the RF induction coil is disposed in parallel to the RF power supply, and the direct current is directly supplied to the coil. In this structure, a TCP coil generates both the RF frequency magnetic field for generating the plasma and the direct-current magnetic field for stabilizing the plasma.

Figure 4A:
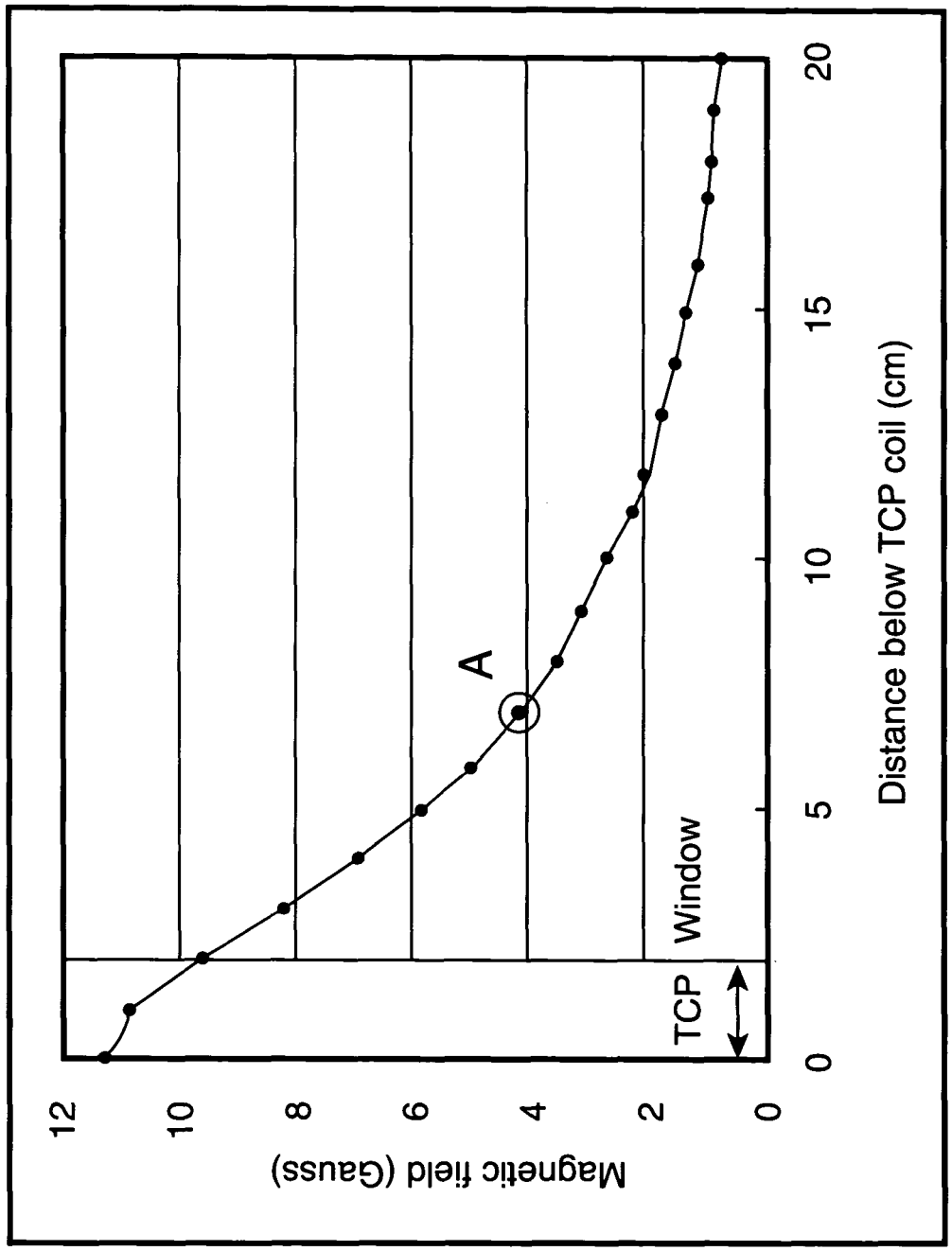
FIG. 4A is a graph showing a change of a magnetic flux density by a distance from the RF induction coil during the supplying of a direct current, in accordance with one embodiment of the invention.
Figure 4B:
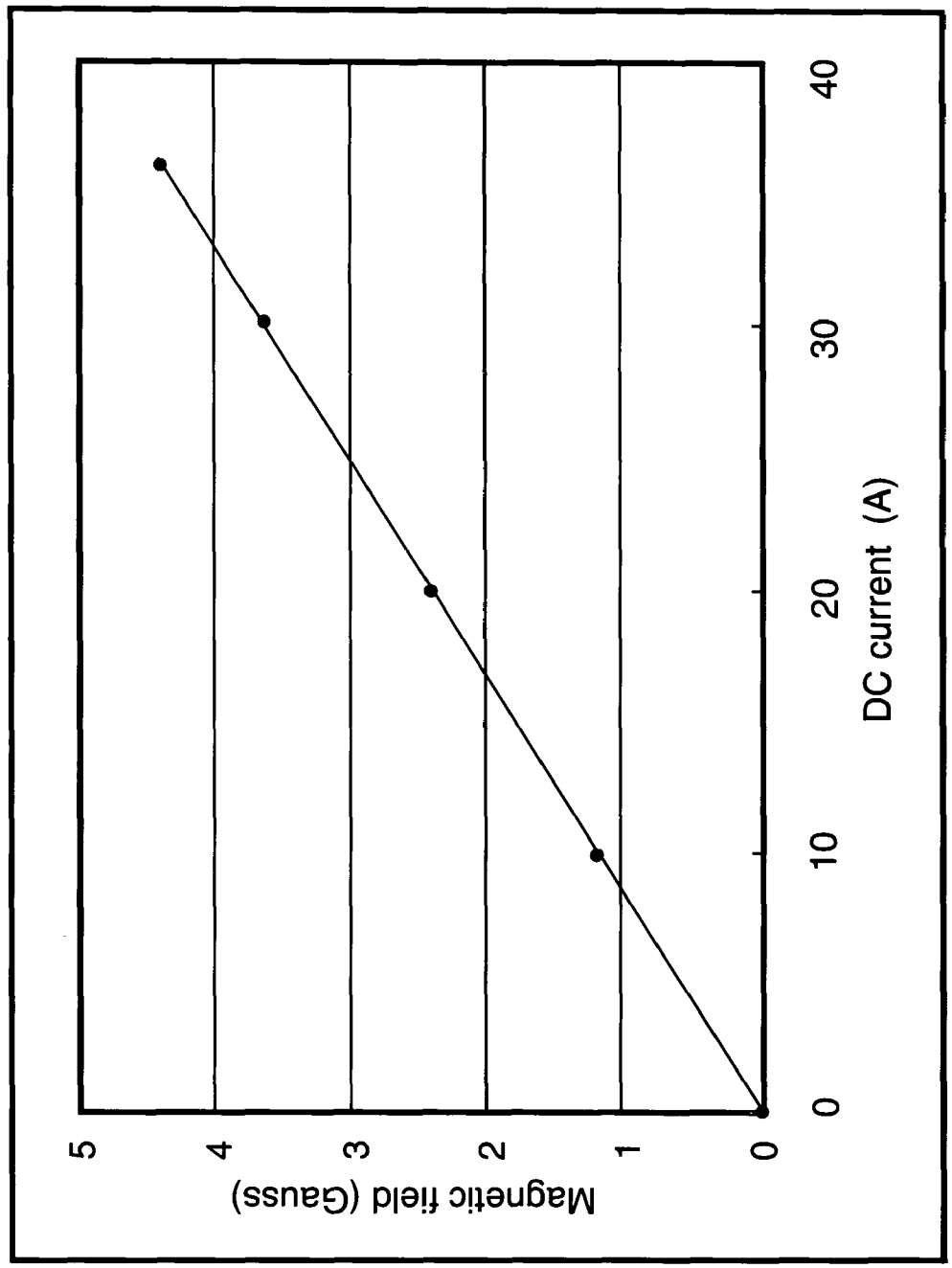
FIG. 4B is a graph showing a supplied direct current and the change of the magnetic flux density in a position of 7 cm from the RF induction coil, in accordance with one embodiment of the present invention.

FIGS. 4A and 4B shows graphs of one example of measured data obtained from the plasma apparatus to which the present invention is applied. FIG. 4A shows a change (Gauss) of the magnetic flux density by a distance (cm) from the RF induction coil during the supplying of a direct current of 36 A. With an increase of the distance (cm), the magnetic flux density (coordinate) drops with a movement of a gentle curve which is inversely proportional and swells downwards. In a position A of the graph, the magnetic flux density has a value of about 4.2 Gausses in a position distant from the coil by 7 cm.

Moreover, FIG. 4B is another graph showing a supplied direct current (A) and the change (Gauss) of the magnetic flux density in a position of 7 cm (position A) from the RF induction coil. As shown in FIG. 4B, a value of magnetic flux density increases substantially proportionally and linearly.

Figure 5A:
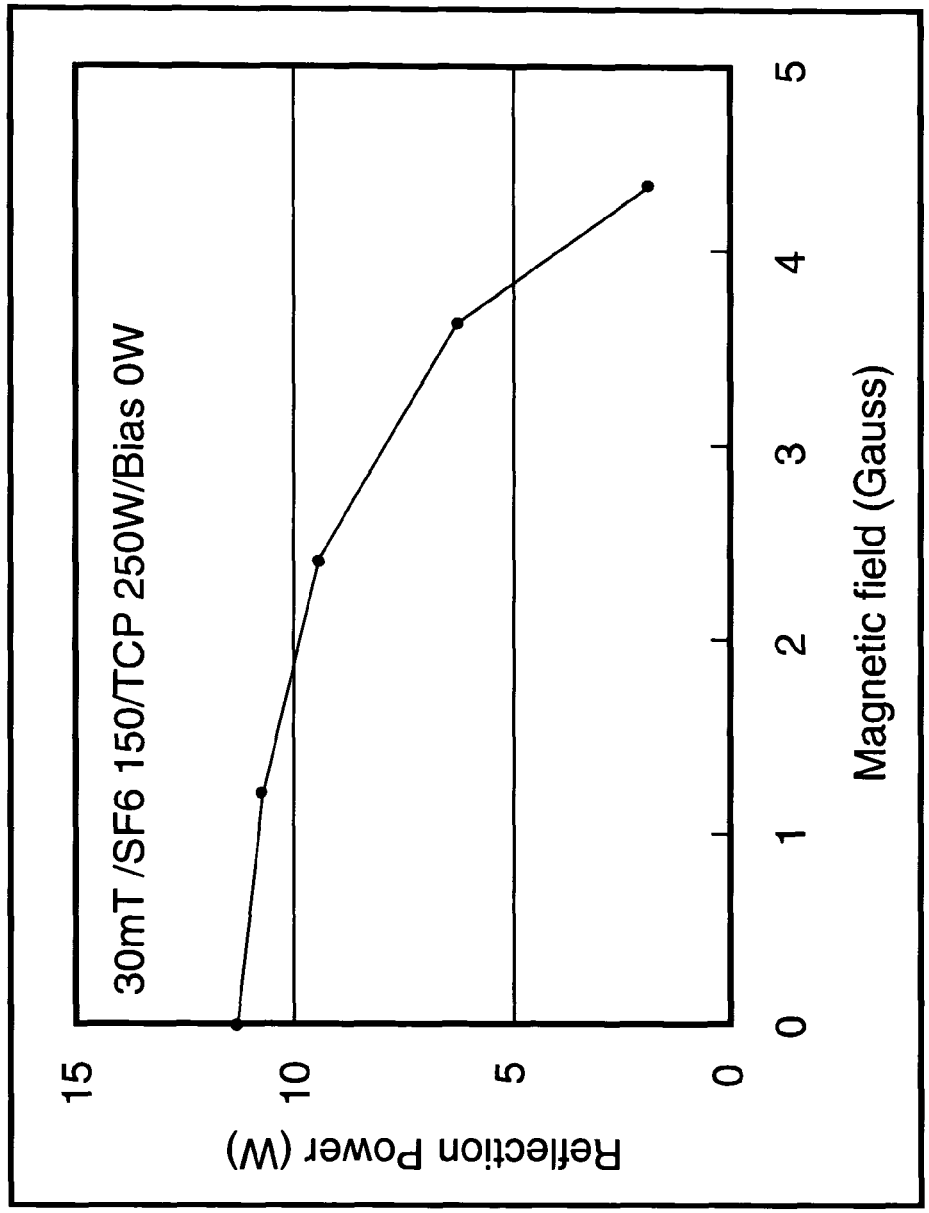
FIG. 5A is a graph showing a reflection power change to a supplied direct-current magnetic flux change, in accordance with an embodiment of the invention.
Figure 5B:
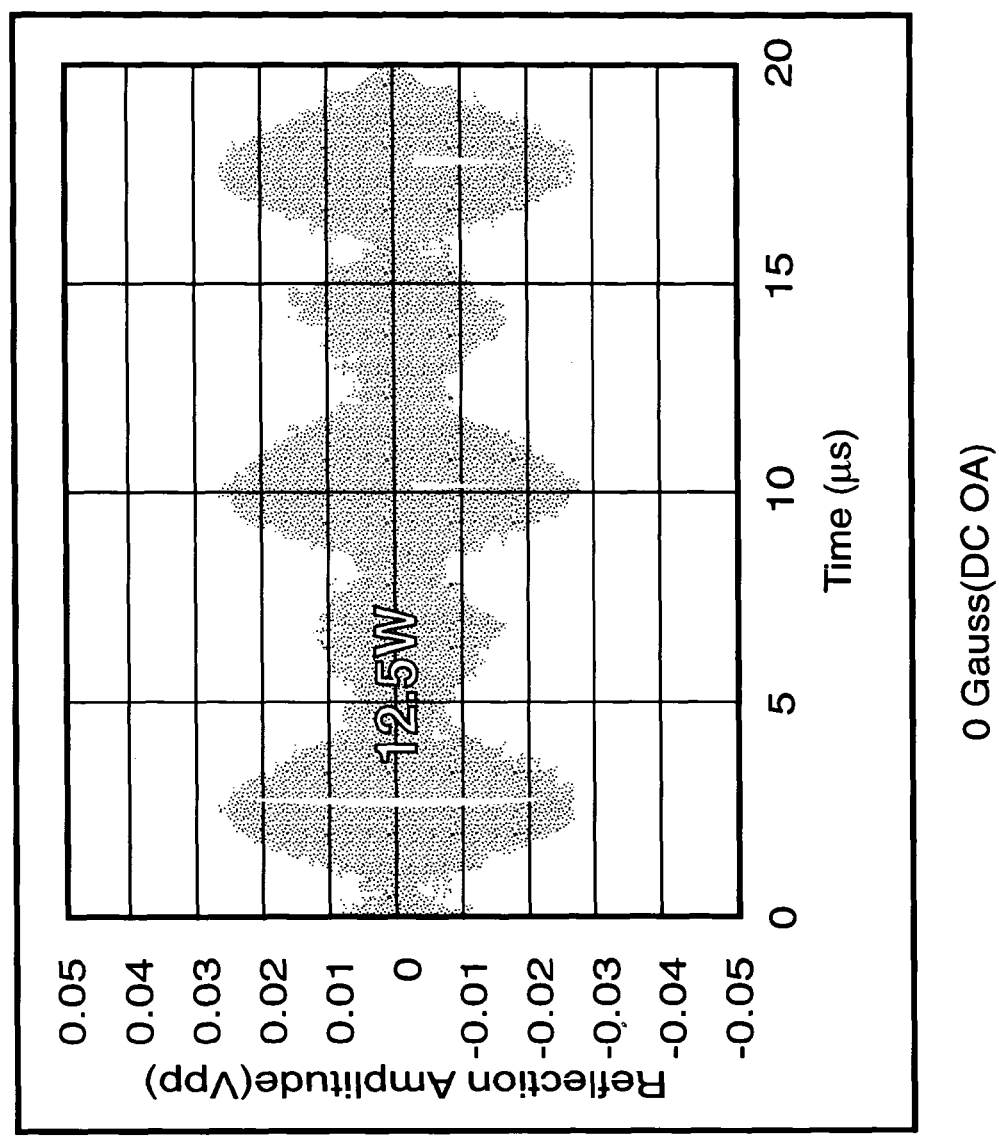
FIG. 5B is a graph showing a reflection waveform during the supplying of a direct-current magnetic field of 0 Gauss.
Figure 5C:
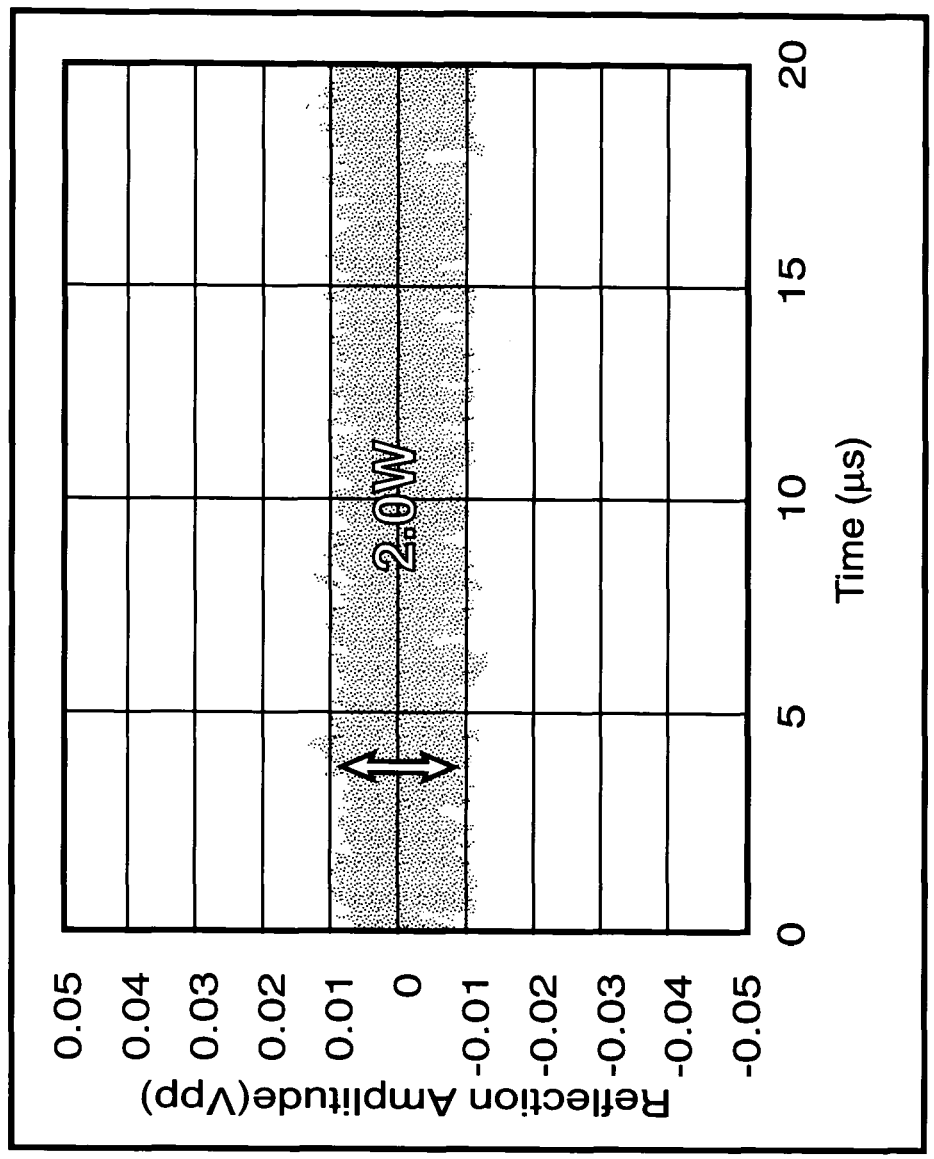
FIG. 5C is a graph showing the reflection waveform during the supplying of a direct-current magnetic field of 4.3 Gausses, in accordance with an embodiment of the present invention.

FIGS. 5A-5C are graphs showing one example of the measured data obtained by the plasma apparatus to which the present invention is applied. FIG. 5A is a graph showing the change of the reflection power (30 mT/SF6 150/TCP 250 W/Bias 0 W) to the change of the supplied direct-current magnetic field (abscissa), and it is apparent that the reflection power decreases with the increase of the direct-current magnetic field. Moreover, FIG. 5B shows that the direct current is not passed without applying the present invention. That is, the graph shows the reflection waveform during the supplying of no direct current at a direct-current magnetic field of 0 Gauss (direct current of 0 A). Similar to the waveform shown in FIG. 2, the waveform of FIG. 5B is shown in which the amplitude of the reflection power largely vibrates with an elapse of time (µs).

With respect to FIG. 5B, FIG. 5C shows that the present invention is applied and the direct current is passed, and shows the reflection waveform during the supplying of a direct-current magnetic field of 4.3 Gausses (direct current of 36 A). This shows a strip-shaped waveform in which the amplitude of the reflection power does not largely fluctuate even with a change of a time (µs) axis, and indicates a substantially constant value (normal value). By comparison of data of FIGS. 5B and 5C, it can be confirmed that there is no amplitude fluctuation of the reflection wave in FIG. 5C, and the instability of the plasma disappears.

As a result of the comparison of the apparatus to which the present invention is applied with the apparatus to which the present invention is not applied, and a verification experiment, when the direct-current magnetic field is supplied to the plasma having caused the instability from the outside, the vibration of the reflection wave into the RF power supply is found to disappear. That is, the plasma instability disappears.

When the method of supplying the direct-current magnetic field according to the present invention is applied, the method of simultaneously superimposing and passing the direct current from the direct-current power supply to the existing inductively coupled coil in parallel to the RF current is used as described above. The concrete apparatus constitution of the method is clearly shown by the plasma apparatus in FIGS. 1 and 3A.

Additionally, as a method of obtaining the direct-current magnetic field, in addition to the method of directly passing the direct current to the RF induction coil as described above, various methods of forming the direct-current magnetic field are considered. The concrete constitution will be described with reference to FIG. 6. According to the constitution, a coil for forming the direct-current magnetic field may be used and disposed in any one of the periphery (side surface), upper surface portion, and bottom surface portion of the chamber of the apparatus. Alternatively, an electromagnet or permanent magnet for supplying the direct-current magnetic field may also be used and disposed in the periphery (side surface), upper surface portion, and bottom surface portion of the chamber.

FIGS. 6A-6D show diagrams of additional embodiments of the plasma apparatus in accordance with the present invention, and show schematic constitution diagrams of various direct-current magnetic field supply methods.

Figure 6A:
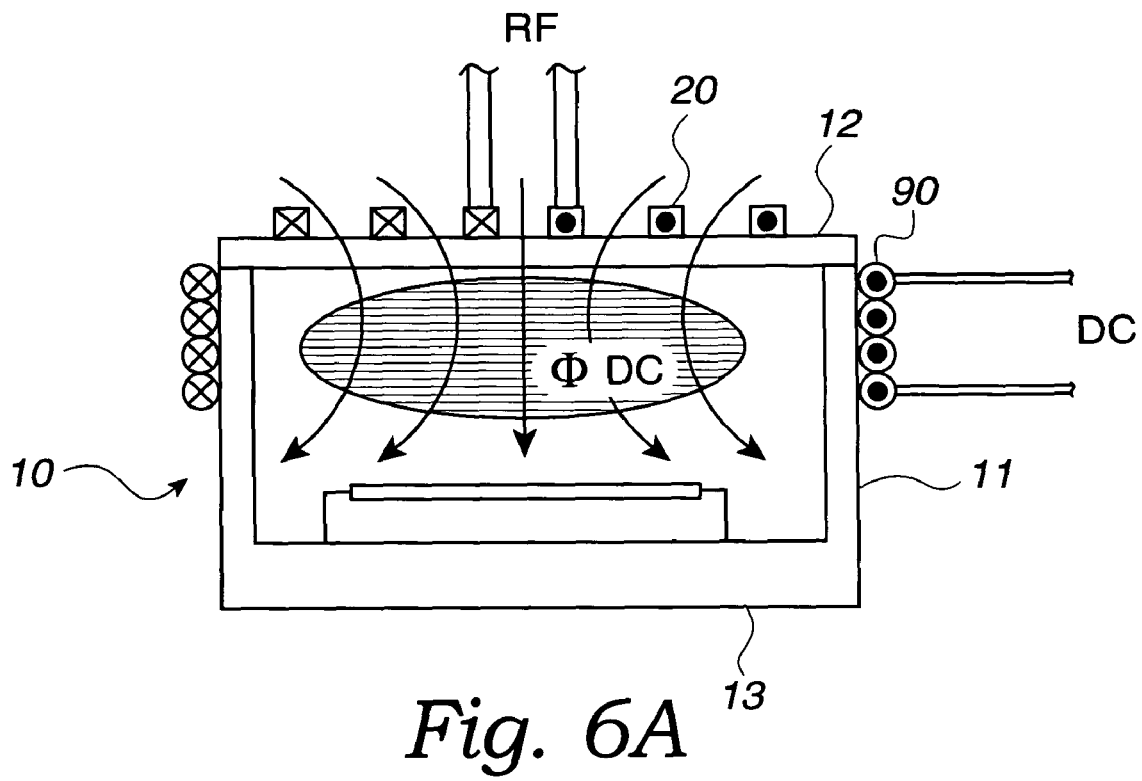
FIG. 6A shows a constitution in which an air-core coil for the direct-current magnetic field is disposed around a chamber, in accordance with one embodiment of the present invention.

FIG. 6A shows an embodiment in which an air-core coil 90 for the direct-current magnetic field is disposed around (outside) the chamber 10. The air-core coil 90 for the direct-current magnetic field is disposed outside the side surface portion 11 close to an upper surface portion 12 side which contacts the RF induction coils 20. According to the structure of the apparatus, a direct-current magnetic flux ($\phi_{DC}$) flows through the inner space of the chamber 10.

Figure 6B:
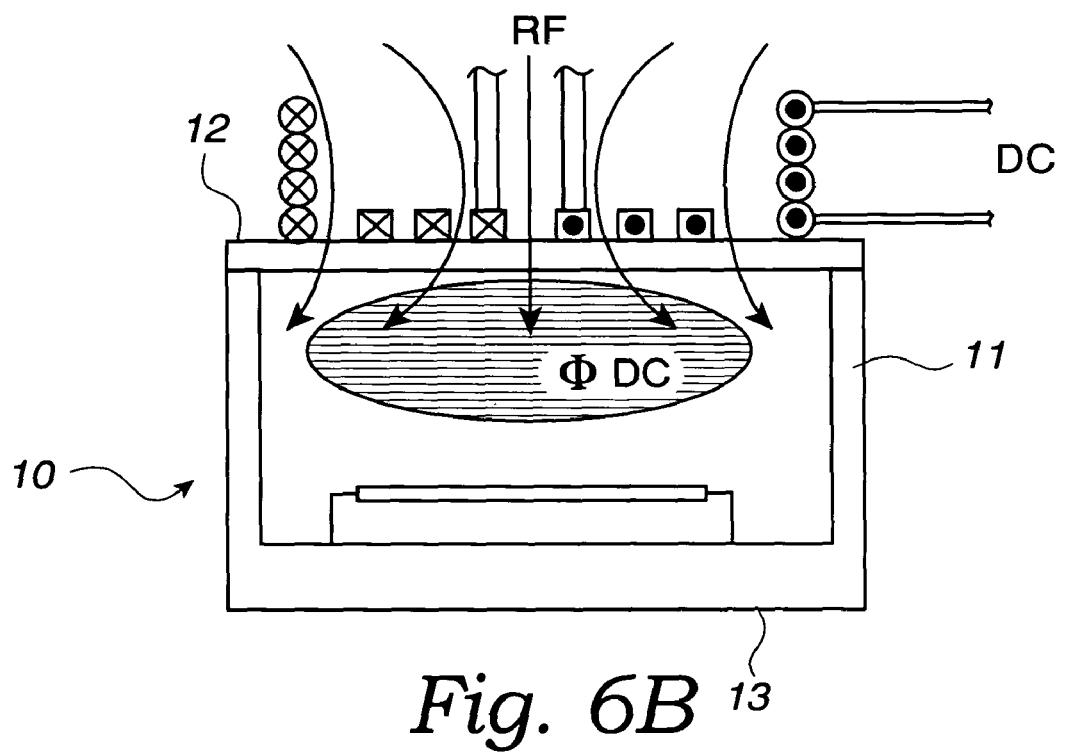
FIG. 6B shows a constitution in which the air-core coil for the direct-current magnetic field is disposed around the chamber, in accordance with an embodiment of the invention.

Next, FIG. 6B shows an embodiment in which the air-core coil 90 for the direct-current magnetic field is disposed above the upper surface portion 12 of the chamber 10. The coils 90 are disposed on left and right sides of the RF coils 20 which contact the upper surface portion 12 in an arrangement structure. Even with the structure of the apparatus, the direct-current magnetic field ($\phi_{DC}$) flows in the inner space of the chamber 10.

Figure 6C:
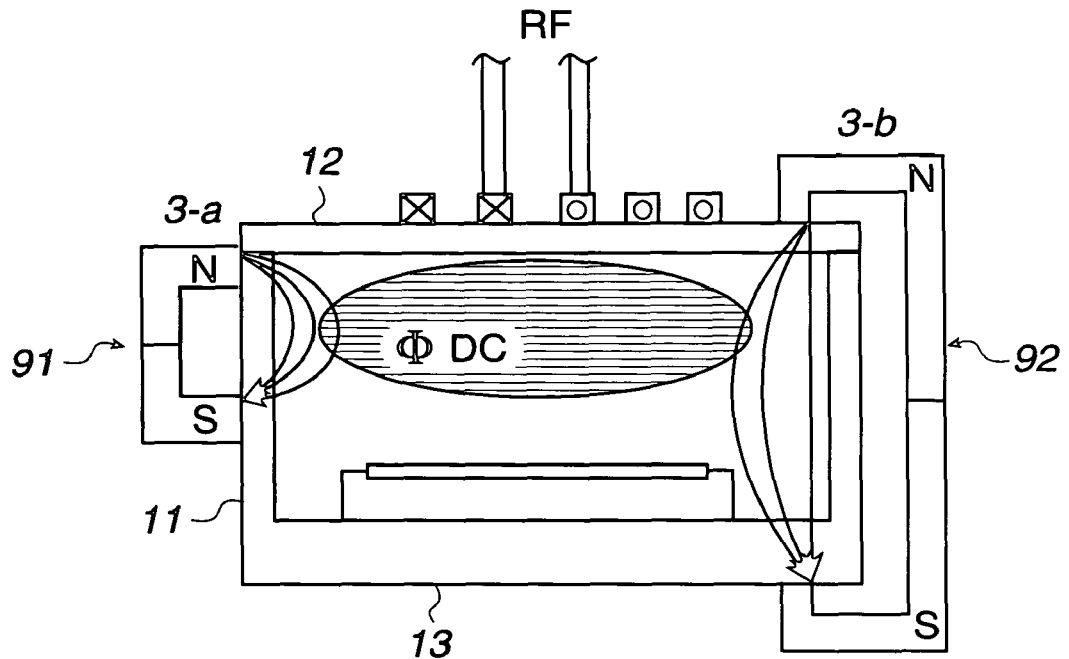
FIG. 6C shows that a magnet for the direct-current magnetic field is disposed around the chamber, in accordance with an embodiment of the present invention.
Figure 6D:
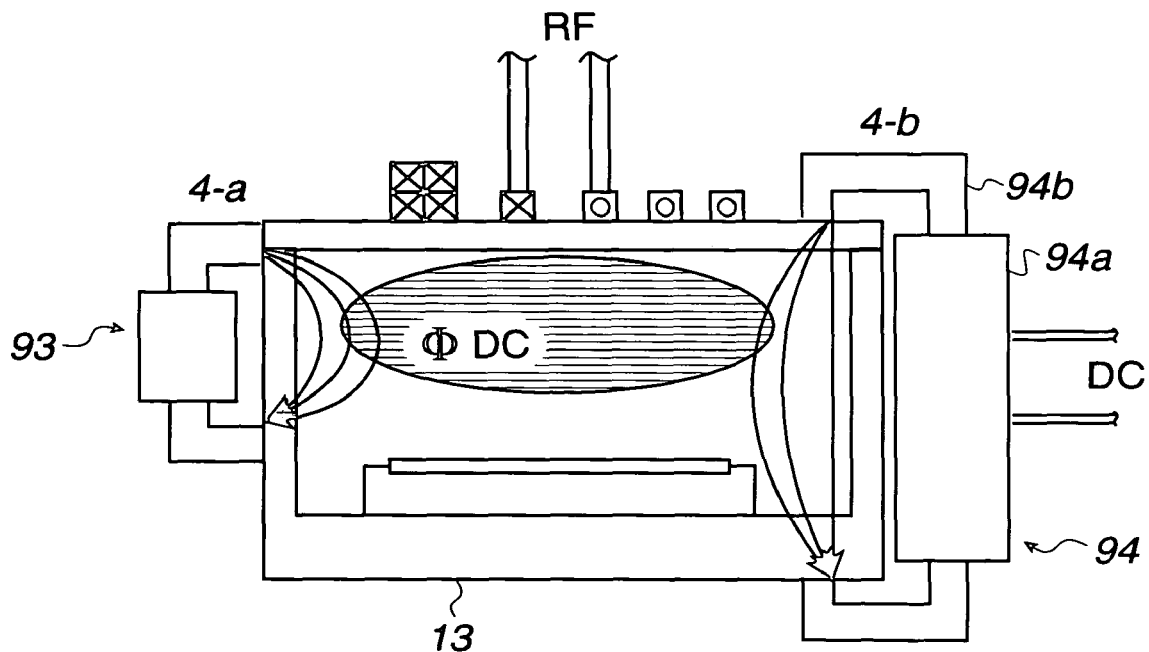
FIG. 6D shows a constitution in which an electromagnet for the direct-current magnetic field is disposed around the chamber, in accordance with another embodiment of the invention.

FIGS. 6C and 6D show embodiments of the present invention in which a magnet for the direct-current magnetic field is disposed around the chamber 10. In a left-side structure 3-a of FIG. 6C, a magnet member 91 is disposed outside the side surface portion 11 of the chamber 10, and thereby the direct-current magnetic field ($\phi_{DC}$) is generated and passed through the inner space of the chamber 10. Moreover, in a right-side structure 3-b of FIG. 6C, a magnet member 92 is used and disposed over the side surface 11 of the chamber 10, and the direct-current magnetic field ($\phi_{DC}$) is generated and passed into the inner space from the upper surface portion 12 and bottom surface portion 13. In the structures of (III) and (IV), the direct-current magnetic field ($\phi_{DC}$) flows in the inner space of the chamber 10.

Moreover, in FIG. 6D, the magnet members 91, 92 for the direct-current magnetic field illustrated in FIG. 6C are replaced with electromagnets 93, 94, and the structure illustrated in FIG. 6C is basically similar to that illustrated in FIG. 6D. The electromagnet 94 includes a solenoid coil 94a and core 94b (such as iron and ferrite) extending from the inside of the coil. The core 94b extending over the side surface portion 11 of the chamber 10 generates and supplies the direct-current magnetic field ($\phi_{DC}$) into the inner space from the upper surface portion 12 and bottom surface portion 13.

The plasma stabilization method and plasma apparatus according to the present invention are used in technical fields of apparatus related to the plasma, such as a semiconductor manufacturing apparatus using the plasma, material manufacturing apparatus using the plasma, fine processing apparatus using the plasma, and surface treatment apparatus using the plasma. When embodiments of the present invention are applied to these apparatuses, very superior effects are obtained.

Moreover, when the direct-current magnetic field is applied according to embodiments of the present invention, the plasma is stabilized and controlled. Additionally, the present invention is expected to be applied to techniques of controlling a plasma density and of controlling unevenness and process ratio, and future usability and effect are large.

According to embodiments of the present invention, an original instability of plasma can technically be clarified and resolved. When hardware having a simple structure is added, a stabilized plasma can be realized. Moreover, in an embodiment of a plasma apparatus including the inductively coupled coils such as ICP and TCP, there is provided a structure in which the direct-current magnetic field can remarkably easily be applied according to the present invention, and practicability is high. Moreover, the carrying out of the present invention provides many industrial advantages that the structure can be compact, space is reduced, cost does not increase, and small investment is possible.

As described above, according to the plasma stabilization method and plasma apparatus of the present invention, when the direct-current magnetic field is applied to an actual manufacturing process, the instability of the plasma (change/fluctuation of the high-speed impedance of the plasma) is removed, and the stabilized plasma apparatus can be realized. Moreover, in the present invention, since the structure of the plasma apparatus is remarkably simple. Therefore, the apparatus is actually applied, the compact constitution can be used as such without increasing the cost.

What is claimed is:

1. A plasma processing apparatus, comprising:
 a processing chamber;
 an object to be processed disposed within the processing chamber;
 a surrounding member disposed around the processing chamber, the surrounding member sealing the chamber and creating an inner space, the surrounding member including a dielectric member sealing an opening on top of the processing chamber;
 an RF induction coil disposed outside and above the dielectric member, the entire RF induction coil being disposed above the dielectric member, a first end and a second end of the RF induction coil connected to a matching network; and
 an RF cut filter connected to a direct current (DC) power supply and connected to the first and second ends of the RF induction coil, the RF cut filter including a first capacitor connected to a positive terminal of the DC power supply and to ground and a second capacitor connected to a negative terminal of the DC power supply and to ground;
 wherein a direct-current magnetic field is supplied to the inner space by the DC power supply in which a direct current is passed through the RF induction coil to obtain the direct-current magnetic field.

2. The plasma processing apparatus of claim 1, wherein the direct current is passed from the direct-current power supply via the RF cut filter simultaneously with an RF current.

3. The plasma processing apparatus of claim 2, wherein the direct current is constituted such that a quantity of the direct current can be varied.

4. The plasma processing apparatus of claim 2, wherein the direct current is constituted such that a polarity of the direct current can be varied.

5. The plasma processing apparatus of claim 1, wherein the RF cut filter further includes a third capacitor connected between the positive terminal and the negative terminal of the DC power supply.

6. In a plasma processing system for the processing of semiconductor wafers, a plasma processing chamber, comprising:
- a surrounding member disposed around the plasma processing chamber, the surrounding member sealing the plasma processing chamber and creating an inner space;
- a dielectric member constituting at least a portion of the surrounding member, the dielectric member being configured as a quartz window;
- an RF induction coil disposed outside and above the surrounding member, the entire RF induction coil being disposed above the surrounding member, a first end and a second end of the RF induction coil connected to a matching network; and
- an RF cut filter connected to a direct current power supply and connected to the first and second ends of the RF induction coil, the RF cut filter including a first capacitor connected to a positive terminal of the DC power supply and to ground and a second capacitor connected to a negative terminal of the DC power supply and to ground.

7. The plasma processing chamber of claim 6, wherein the surrounding member includes a top surface portion, a side surface portion and a bottom surface portion.

8. The plasma processing chamber of claim 7, wherein the dielectric member is disposed in the top surface portion.

9. The plasma processing chamber of claim 6, wherein the RF cut filter further includes a third capacitor connected between the positive terminal and the negative terminal of the DC power supply.

* * * * *